US006847313B2

United States Patent
Biswas

(10) Patent No.: US 6,847,313 B2
(45) Date of Patent: Jan. 25, 2005

(54) RATIONAL SAMPLE RATE CONVERSION

(75) Inventor: Ashim Biswas, Bangalore (IN)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/611,078

(22) Filed: Jun. 30, 2003

(65) Prior Publication Data

US 2004/0263363 A1 Dec. 30, 2004

(51) Int. Cl.[7] .............................................. H03M 7/00
(52) U.S. Cl. .............................................. 341/61; 341/143
(58) Field of Search ........................... 341/61, 50, 143; 375/350

(56) References Cited

U.S. PATENT DOCUMENTS

| 5,821,884 A | * | 10/1998 | Lee ............................ 341/61 |
| 5,986,589 A | * | 11/1999 | Rosefield et al. ............. 341/61 |
| 6,388,600 B1 | * | 5/2002 | Johnson et al. ............. 341/155 |
| 2002/0034272 A1 | * | 3/2002 | Freidhof et al. ............ 375/350 |

* cited by examiner

Primary Examiner—Peguy JeanPierre
(74) Attorney, Agent, or Firm—John F. Kacvinsky

(57) ABSTRACT

A method and apparatus to perform sample rate conversion using multiple Multiply-Accumulate (MAC) units are described.

21 Claims, 6 Drawing Sheets

300

$$\begin{bmatrix} x_0 & 0 & 0 & 0 & \cdots & 0 \\ x_1 & x_0 & 0 & 0 & \cdots & 0 \\ x_2 & x_1 & x_0 & 0 & \cdots & 0 \\ x_3 & x_2 & x_1 & x_{I+1} & \cdots & \\ \vdots & \vdots & \vdots & \vdots & & \vdots \\ x_{\left(\frac{N-1}{I}\right)(I-1)} & \cdots & x_{N-I} & x_{N-I+1} & \cdots & x_{N-I} \\ \vdots & & \vdots & \vdots & & \vdots \end{bmatrix} \otimes \begin{bmatrix} h_0 & h_I & h_{2I} & \cdots & h_{N-I} \\ h_1 & h_{I+1} & & & h_{N-I+1} \\ h_{2I} & \vdots & & & \vdots \\ \vdots & & & & \\ h_{I-1} & h_{2I-1} & \cdots & & h_{N-1} \end{bmatrix} = \begin{bmatrix} y_0 & y_1 & y_2 & \cdots & y_{I-1} \\ y_I & y_{I+1} & & & y_{2I-1} \\ y_{2I} & & & & \vdots \\ y_{3I} & & & & \\ \vdots & & & & \\ \end{bmatrix}$$

FIG. 3

$$Y = \begin{bmatrix} \underline{y_0} & y_1 & y_2 & y_3 \\ y_4 & y_5 & y_6 & y_7 \\ y_8 & \underline{y_9} & y_{10} & y_{11} \\ y_{12} & y_{13} & y_{14} & y_{15} \\ y_{16} & y_{17} & \underline{y_{18}} & y_{19} \\ y_{20} & y_{21} & y_{22} & y_{23} \\ y_{24} & y_{25} & y_{26} & \underline{y_{27}} \\ y_{28} & y_{29} & y_{30} & y_{31} \\ y_{32} & y_{33} & y_{34} & y_{35} \\ \underline{y_{36}} & y_{37} & y_{38} & y_{39} \\ y_{40} & y_{41} & y_{42} & y_{43} \\ y_{44} & \underline{y_{45}} & y_{46} & y_{47} \\ y_{48} & y_{49} & y_{50} & y_{51} \\ y_{52} & y_{53} & \underline{y_{54}} & y_{55} \\ y_{56} & y_{57} & y_{58} & y_{59} \\ y_{60} & y_{61} & y_{62} & \underline{y_{63}} \end{bmatrix}$$

RATIONAL SAMPLE RATE CONVERSION

BACKGROUND

Many digital signal processing systems may need a multirate filter. A multirate filter may convert a digital signal sampled at a particular frequency to a digital signal sampled at a different specified frequency. The performance of a multirate filter may be improved by increasing the total number of multiplications performed per second during the conversion process. Consequently, there may be need for improvements in such techniques in a device or network.

BRIEF DESERTION OF THE DRAWINGS

The subject matter regarded as the embodiments is particularly pointed out and distinctly claimed in the concluding portion of the specification. The embodiments, however, both as to organization and method of operation, together with objects, features, and advantages thereof, may best be understood by reference to the following detailed description when read with the accompanying drawings in which:

FIG. 3 illustrates a set of matrices for polyphase filtering in accordance with one embodiment;

FIG. 4 illustrates a Y matrix in accordance with one embodiment;

DETAILED DESCRIPTION

Figure 1:
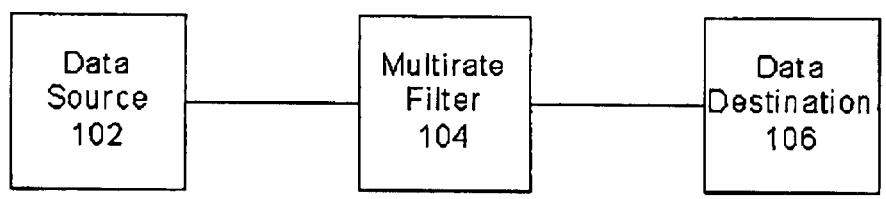
FIG. 1 illustrates a system suitable for practicing one embodiment.

The embodiments may be directed to a multirate filter for a digital signal processing system, such as used in a communication system, for example. A multirate filter may convert an input signal sampled at a first sampling rate ("input sampling rate") to an output signal sampled at a second sampling rate ("output sampling rate"). In other words, a multirate filter may comprise a filter in which the input sampling rate and the output sampling rate are not equal. The term "sampling rate" as used herein may refer to sampling the instantaneous amplitude variation of a signal at discrete values in time. The sampling rate may be expressed as the number of samples per second. For example, if a signal has a maximum frequency component of 5 kilohertz (kHz), then the sampling rate may comprise 10,000 samples per second. The sampling rate may also be referred to herein as the sampling frequency.

A multirate filter typically performs a large number of multiply-accumulate operations in converting a signal from the input sampling rate to the output sampling rate. The multiply-accumulate operations may be performed by, for example, a Multiply-Accumulator (MAC) unit. The MAC unit is typically part of the processing architecture used to implement the multirate filter. A multirate filter operating on a system with a processor having a single MAC unit can typically process a single sample per computational cycle. If the processor comprises multiple MAC units, however, it may be possible to process multiple samples per computational cycle. Processing multiple samples per computational cycle may increase the overall performance of the multirate filter.

The embodiments may comprise a method and apparatus to perform sampling rate conversion for a multirate filter using multiple MAC units. In one embodiment, for example, a first signal may be received at a first sampling rate. The first signal may be converted to a second signal with a second sampling rate using a plurality of MAC units and a differential offset parameter. The efficient use of a plurality of MAC units may increase the number of multiplications performed per computational cycle, and therefore increase the throughput of the multirate filter. Improvements in the performance of multirate filters may lead to faster and more reliable communication services provided by communication systems in general.

It is worthy to note that any reference in the specification to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Numerous specific details may be set forth herein to provide a thorough understanding of the embodiments. It will be understood by those skilled in the art, however, that the embodiments may be practiced without these specific details. In other instances, well-known methods, procedures, components and circuits have not been described in detail so as not to obscure the embodiments. It can be appreciated that the specific structural and functional details disclosed herein maybe representative and do not necessarily limit the scope of the embodiments.

Referring now in detail to the drawings wherein like parts are designated by like reference numerals throughout, there is illustrated in FIG. 1 a system suitable for practicing one embodiment FIG. 1 is a block diagram of a digital signal processing system 100. In one embodiment, system 100 may comprise a data source 102, a multirate filter 104 and a data destination 106. Data source 102 may be any device or element that originates a signal sampled at an input sampling rate. Data destination 106 may any device or element that receives the signal sampled at an output sampling rate. Multirate filter 104 may convert the signal from the input sampling rate to the output sampling rate. Although FIG. 1 shows only three elements, it can be appreciated that any number of system elements may be added to system 100 and still fall within the scope of the embodiments.

In one embodiment, one or more communications mediums may connect the various elements. The tem "communications medium" as used herein may refer to any medium capable of carrying information signals. Examples of communications mediums may include metal leads, semiconductor material, twisted-pair wire, co-axial cable, fiber optic, radio frequencies (RF) and so forth. If the communications medium comprises RF spectrum, then the embodiments may have the requisite elements needed to transmit and receive information, such as a transceiver and omnidirectional antenna, for example. The terms "connection" or "interconnection," and variations thereof, in this context may refer to physical connections and/or logical connections.

System 100 may be representative of, for example, any number of systems that require a digital signal processing component. For example, system 100 may represent a multimedia communication system wherein multimedia information is compressed, stored and/or played out at a later time. Examples of multimedia information may include any multimedia data, such audio and video information.

Examples of audio information may comprise speech, speech utterances, silence periods, background noise, comfort noise, tones, music, control signals, and so forth, Examples of video information may comprise images, frames, video frames, streaming video, graphics and so forth. An example of a multimedia communication system may comprise a digital audio system, a digital video system, analog voice privacy system, transmultiplexer system, multirate adaptive filter system, Voice Over Packet (VQP) system, a cellular system, large size plasma or other displays, a cable system, a satellite system and so forth. The embodiments are not limited in this context.

In one embodiment, for example, data source 102 may comprise a studio recording system to record and store music. Data source 102 may produce a signal having a sampling rate of 48 kHz. Data destination 106 may comprise a Compact Disc (CD) mastering system. The CD mastering system may be used to store music on multiple CDs. Data destination 106 may require a sampling rate of 44.1 kHz. In this example, multirate filter 104 may receive the first signal from data source 102 at 48 kHz, convert the signal to 44.1 kHz, and send the converted signal to data destination 106. In another example, data destination 106 may comprise a digital audio broadcast system requiring a sampling rate of 32 kHz. In this example, multirate filter 104 may convert the signal from 48 kHz to 32 kHz.

In one embodiment, for example, data source 102 may comprise a digital camera or digital video camera, and data destination 106 may comprise a storage system, such as a hard drive. For example, it may be desirable to compress the images received from data source 102 for storage on data destination 106 to conserve storage resources. In another example, the storage system may be used with an image recognition system. The high pixel density provided by the hardware for data source 102 may not necessarily be required to perform image recognition, and therefore the received frames can be down-sampled, processed and/or stored by a recognition engine.

In one embodiment, for example, data source 102 may comprise a digital telephone network. In this example, data source 102 may comprise a Time Division Multiplex (TDM) system, and data destination 106 may comprise a Frequency Division Multiplex (FDM) system. Multirate filter 104 may convert the signal from the TDM system to the required sampling rate needed by the FDM system.

In one embodiment, for example, data source 102 may comprise part of a mobile is handset. The mobile handset may receive analog audio signals from a human speaker, and convert the analog signals to digital signals using an Analog-to-Digital (A/D) converter. The digital audio signals may need to be stored in the handset memory, or perhaps converted to a lower sampling rate for the voice coder/decoder "codec"). Multirate filter 104 may receive the digital audio signals at an input sampling rate, which may be significantly higher than necessary to accurately represent the human voice, to an output sampling rate that is relatively low to conserve memory resources during storage. In this example, data destination 106 may comprise a memory. The converted digital audio signal at the output sampling rate may be sent to the memory for later processing.

More particularly, there are typically three types of multirate filters. The first type of multirate filter may comprise an interpolation filter. The second type may comprise a decimation filter. The third type may comprise a combination of an interpolation filter and decimation filter.

An interpolation filter may be used to increase the output sampling rate by inserting new sample points between the original sample values. The values of the new sample points are set to zero. An interpolation filter may be desirable near a physical interface such as a Digital to Analog (D/A) converter, for example. In this case the interpolation filter may output the signal with an increased sampling rate to the D/A converter, and thereby generate more sample values to create a smoother waveform.

A decimation filter may be used to decrease the output sampling rate by removing sample values from the original set of sample values. A decimation filter may also be desirable near a physical interface, such as an A/D converter. Using a decimation filter to receive information from the A/D converter may allow the data to be downsampled to a point where it can be correctly recovered at a later time.

A combination interpolation filter and decimation filter may be used to change the output sampling rate by a non-integer factor. The non-integer factor may be represented by a rational number, e.g., a ratio of two integers. For example, if the two integers were identified as I and D, respectively, the ratio of I/D should be as close to the desired factor as possible. The ratio of I/D may be referred to herein as a conversion rate. Typically in such combination filters, first interpolation by factor I is done, followed by decimation by a factor of D. Interpolation is typically performed first since the decimation process may remove some desired frequency components from the signal, although the embodiments are not limited in this context.

Figure 2:
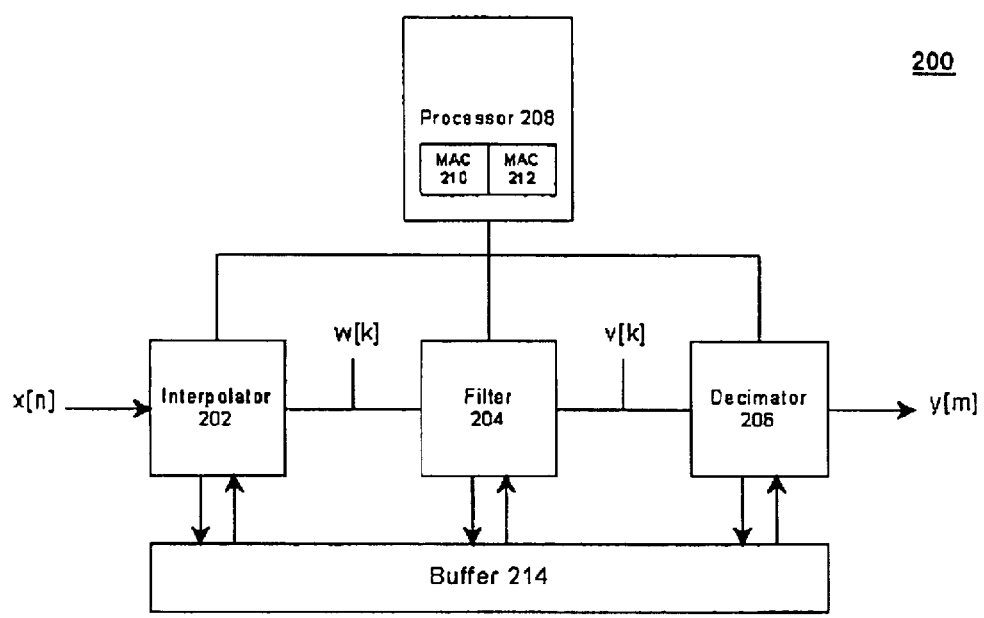
FIG. 2 illustrates a block diagram of a multirate filter in accordance with one embodiment.

It is worthy to note that interpolation and decimation are not inverse processes, meaning that a signal run through an interpolation filter followed by a decimation filter does not necessarily produce the original signal. For example, assume that the interpolation factor is I=3, and the decimation factor is D=2. The conversion rate for this example would be a non-integer factor of 3/2. The interpolation filter may receive a 2 kHz signal, and increase the signal to 6 kHz by a factor of 3. The increased signal may be filtered and then decimated by the decimation filter to 3 kHz by a factor of 2. In this manner, the combination interpolation and decimation filters may increase the signal from 2 kHz to 3 kHz FIG. 2 may illustrate a multirate filter in accordance with one embodiment. FIG. 2 may illustrate a multirate filter 200. Multirate filter 200 may be representative of, for example, multirate filter 104 of system 100. Multirate filter 200 may comprise a combination filter of the third type described above. In general operation, multirate filter 200 may convert a digital signal from an input sampling rate to an output sampling rate. The input sampling rate and output sampling rate may be different, and further may be any sampling frequency desired for a particular implementation.

Multirate filter 200 and its elements may be implemented using an architecture that may vary in accordance with any number of factors, such as desired computational rate, power levels, heat tolerances, processing cycle budget, input data rates, output data rates, memory resources, data bus speeds and other performance constraints. For example, one embodiment may be implemented using software executed by a processor. The processor may be a general-purpose or dedicated processor. The software may comprise computer program code segments, programming logic, instructions or data. The software may be stored on a medium accessible by a machine, computer or other processing system. Examples of acceptable mediums may include computer-readable mediums such as read-only memory (ROM), random-access memory (RAM), Programmable ROM (PROM), Erasable PROM (EPROM), magnetic disk, optical disk, and so forth. In one embodiment, the medium may store programming instructions in a compressed and/or encrypted format, as well as instructions that may have to be compiled or installed by an installer before being executed by the processor. In another example, one embodiment may be implemented as dedicated hardware, such as an Application Specific Integrated Circuit (ASIC), Programmable Logic Device (PLD) or Digital Signal Processor (DSP) and accompanying hardware structures. In yet another example, one embodiment may be implemented by any combination of programmed general-purpose computer components and custom hardware components. The embodiments are not limited in this context.

In one embodiment, multirate filter 200 may comprise an interpolator 202, a Low Pass Filter (LPF) 204, and a decimator 206, all of which may be connected to a processor 208 and a buffer 214. Processor 208 may further comprise MAC units 210 and 212. Although a single processor 208 is shown for purposes of clarity, it may be appreciated that multirate filter 200 may utilize any number of processors and still fall within the scope of the embodiments. Further, it may be appreciated that any number of MAC units, and any number of buffers, may be used as desired for a particular implementation. In addition, the functions provided by any of the elements of multirate filter 200 may be implemented using more or less elements, and still fall within the scope of the embodiments.

In one embodiment, interpolator 202 may receive a first signal x[n] that represents a plurality of input sample values sampled at an input sampling rate. Interpolator 202 may increase the input sampling rate of the first signal x[n] by generating new sample values that are inserted between the input sample values. Interpolator 202 may output an intermediate signal w[k] comprising a plurality of intermediate sample values at an intermediate sampling rate. More particularly, interpolator 202 may insert I-1 zero-valued samples between two samples of the original signal x[n] to form a new signal w[k].

LPF 204 may receive the intermediate signal w[k] and perform low pass filtering on it. Inserting zeros into the data in the time domain may create reflections or signal images of the original spectrum in the frequency domain. The reflections may represent noise. LPF 204 may remove the noise from intermediate signal w[k]. LPF 204 may output a filtered intermediate signal v[k] at an intermediate sampling rate. LPF 204 may also be referred to sometimes as a synthesis filter.

LPF 204 may also assist in preparing the intermediate signal for input to decimator 206. In this role, LPF 204 may attempt to reduce aliasing by limiting each channel's bandwidth by a certain amount. LPF 204 may also be referred to sometimes as an analysis filter or anti-aliasing filter while providing this function.

Decimator 206 may receive the filtered intermediate signal v[k] and perform decimation on the filtered intermediate signal. Decimator 206 may decrease the intermediate sampling rate to yield the output sampling rate. Decimator 206 accomplishes this by removing D-1 sample values from the original block of sample values of size D. Decimator 206 may output a second signal y[m] at the output sampling rate.

In one embodiment, each element or stage of multirate filter 200 may be implemented using a polyphase structure to reduce the computation rate. A polyphase structure typically comprises multiple shorter filters that operate at different points in time. This technique may be referred to as polyphase decomposition. Therefore, in one embodiment interpolator 202 may operate as a polyphase interpolator, and decimator 206 may operate as a polyphase decimator.

The use of polyphase structures may reduce the overall performance requirements for multirate filter 200. This may be further described with reference to FIGS. 3–6.

FIG. 3 illustrates a set of matrices for polyphase filtering in accordance with one embodiment. FIG. 3 illustrates a set of matrices 300 for a polyphase filter. In one embodiment, the vector of filter coefficients $\{h_0, h_1, \ldots h_{N-1}\}$ for the polyphase filter may be formed into a matrix H of I columns and N/I rows, where N represents a length of vector h[n]. Vector h[n] may represent the filter as implemented as a Finite Impulse Response (FIR) filter. The input array x[n] may be formed into a matrix X having N/I columns. The rows of X may represent the state of the shift registers for the filter at consecutive instances of time at the input sampling rate. The length selected for input buffer 214 may determine the number of rows. The convolution of X and H produces a Y matrix, from which samples are picked based on decimation factor D. An example of a Y matrix may be discussed with reference to FIG. 4.

FIG. 4 illustrates a Y matrix in accordance with one embodiment. FIG. 4 illustrates a Y matrix 400. The output sampling rate can be generated by selecting every $D^{th}$ element from Y matrix 400 by iterating row-wise. For example, the output sample values for second signal y[m] should comprise $\{y_0, y_D, y_{2D}, y_{3D} \ldots \}$. Avoiding the computation of unused elements in the Y matrix further increases the efficiency of multirate filter 200.

More particularly, Y matrix 400 demonstrates a Y matrix for a sampling conversion rate I/D, where I=4 and D=9, or 4/9. The underlined elements of the Y matrix 400 denote the output sample values for second signal y[m]. As shown in the Y matrix 400, every $9^{th}$ element is underlined.

If processor 208 of multirate filter 200 included a single MAC unit, then each of the output elements for second signal y[m] may need to be calculated at a rate of one per computational cycle. Processor 208 as shown in FIG. 2, however, comprises at least 2 MAC units 210 and 212. Therefore, multirate filter 200 should be able to process multiple output elements for second signal y[m] in parallel per computational cycle.

In one embodiment, the number of output sample values that can be calculated in parallel may equal the number of MAC units available to processor 208. This can be accomplished as long as processor 208 utilizes Single Instruction Multiple Data (SIMD) instructions that can be executed in parallel with one or more SIMD instructions. It can be appreciated that the number of MAC units for processor 208, and therefore parallel processed output sample values, are not limited in this context.

As shown by matrices 300 and Y matrix 400, the columns of Y matrix 400 are calculated by a single column of the H matrix. Since processor 208 includes 2 MAC units 210 and 212, the output sample values $\{y_0, y_{36}\}$ can be calculated in parallel. This may be implemented using 3 buffer pointers for buffer 214. The first buffer pointer may point to $x_0$, the second buffer pointer may point to $x_9$, and the third buffer pointer may point to the first column of the H matrix. This process may continue for the other output sample values $\{y_9, y_{45}\}$, $\{y_{18}, y_{54}\}$ and $\{y_{27}, y_{63}\}$, respectively, for example.

It may be appreciated that all the rows of the X matrix may not be useful and therefore may be skipped while calculating multiple output sample values. For example, this may occur in the case where 3I>D>2I. In the case where 2I>D>I, all rows of the X matrix will be potentially useful. In the case where I>D>0, each row of X will be used to calculate multiple output sample values.

In one embodiment, a differential offset parameter may be used to calculate the multiple output sample values. The input row vector of the X matrix should be shifted (or not shifted) by a particular value, and may need to be convoluted by a particular column of the X matrix. The information indicating when to shift and by what amount is is encoded into the differential offset parameter. The differential offset parameter may be constant for a given value for I and D. The use of the differential offset parameter not only facilitates the calculation of multiple output sample values, but also may reduce or avoid the use of if-then-else type statements in the algorithm. Reducing or avoiding if-then-else type statements may further increase performance of multirate filter 200.

Table I may demonstrate the calculations for deriving the differential offset parameter for a multirate filter 200 having a sampling conversion rate I/D, wherein I=4 and D×7, or 4/7 filter.

TABLE 1

| R<br>0 to (I − 1) | 0 | 1 | 2 | 3 | Differential<br>Coded<br>Offset |
|---|---|---|---|---|---|
| Offset<br>(r*D)/I | 0 | 1 | 3 | 5 | |
| Differential<br>Offset<br>(2-bit<br>Binary) | — | 1<br>(01) | 2<br>(10) | 2<br>(10) | 0 × 29<br>(10 10 01) |

As shown in Table 1, the number of shift values or offsets needed for a particular implementation is dependent upon. Generally, the offsets should be small numbers. Therefore, it maybe more efficient to store the differences between consecutive values in the differential offset table rather than absolute values. For example, if 2 bits are used for each differential offset parameter, then shift up to 3 (i.e., D<4I) can be handled. This should be sufficient for most implementations since the fitter may be separated into multiple cascaded stages of filters when I and D are large and relatively prime to each other. Further, I groups of 2-bit values may be stuffed in 8-bits or 16-bits, depending on the type of processor for processor 208.

Table 2 below may illustrate a list of predetermined differential offset parameters for various types of I/D multirate filters.

TABLE 2

| Filter | Differential Offset (Hex) |
|---|---|
| 4/9 | 0x002A |
| 5/7 | 0x0065 |
| 7/5 | 0x0514 |
| 9/4 | 0x1110 |
| 9/8 | 0x5554 |

The operations of systems 100 and 200 may be further described with reference to FIG. 5 and accompanying examples. Although FIG. 5 as presented herein may include a particular programming logic, it can be appreciated that the programming logic merely provides an example of how the general functionality described herein can be implemented. Further, the given programming logic does not necessarily have to be executed in the order presented unless otherwise indicated.

Figure 5:
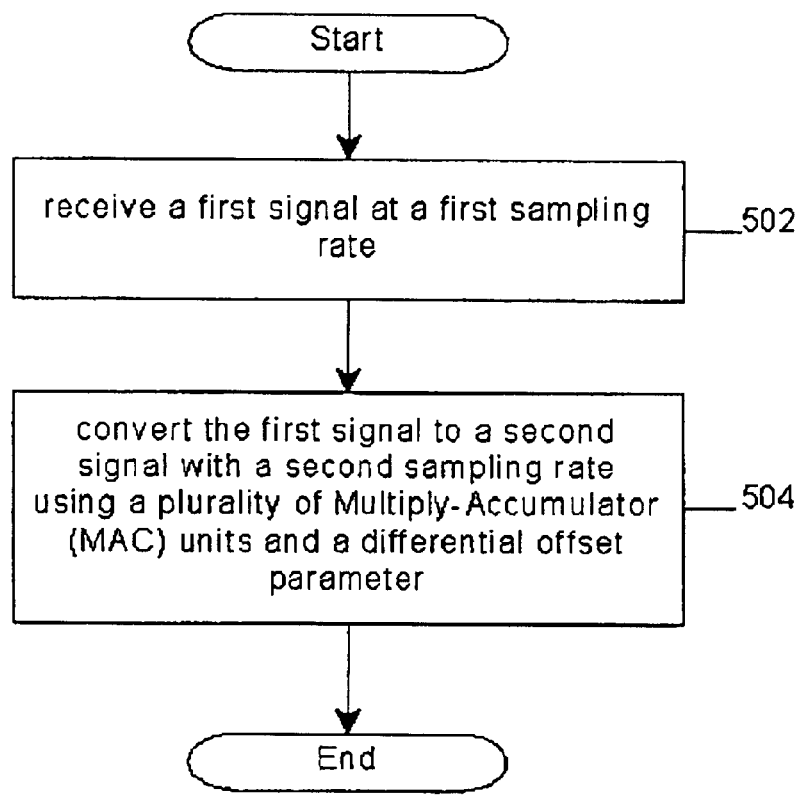
FIG. 5 is a block flow diagram of the programming logic performed by a multirate filter in accordance with one embodiment.

FIG. 5 is a block flow diagram of the operations performed by a multirate filter in accordance with one embodiment. In one embodiment, the multirate filter may refer to the software and/or hardware used to implement the functionality for one or more embodiments as described herein. In this embodiment, the multirate filter may be implemented as a DSP and accompanying architecture. It can be appreciated that this functionality, however, may be implemented by any elements, or combination of elements, located anywhere in system 100 and still fall within the scope of the embodiments.

FIG. 5 illustrates a first block flow diagram of the programming logic for a multirate filter in accordance with one embodiments FIG. 5 illustrates a programming logic 500. Programming logic 500 may illustrate the programming logic to perform sampling rate conversion for a multirate filter. A first signal having a first sampling rate may be received at block 502. The first signal may have a plurality of input samples. The first signal may be converted to a second signal having a second sampling rate using a plurality of MAC units and a differential offset parameter at block 504. The second signal may also have a plurality of output samples.

Figure 6:
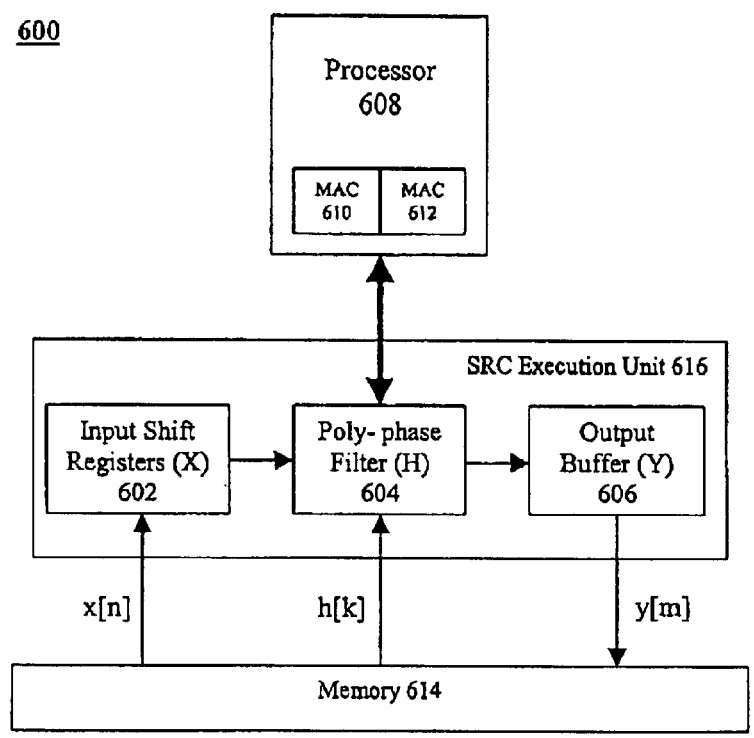
FIG. 6 is a block diagram of a Polyphase Multirate Filter System (PMFS) in accordance with one embodiment.

FIG. 6 illustrates a block diagram for a polyphase multirate filter system (PWS) in accordance with one embodiment. FIG. 6 illustrates a PMFS 600. PMSF 600 may comprise an implementation of multirate filter 200, for example, although the embodiments are not limited in this context. In one embodiment, PMFS 600 may comprise a Sample Rate Conversion (SRC) Execution Unit 616, connected to a processor 608 and a memory 614. SRC 616 may further comprise input shift registers (X) 602, a polyphase filter (H) 604 and an output buffer(Y) 606. Processor 608 may flier comprise MAC units 610 and 612, although the embodiments are not limited in this context.

SRC 616 may perform sample rate conversion in accordance with the following pseudo code:

```
Taps = N/I
for 1 = 0 to I-1 do
    x_array1 = x
    for j = 0 to M-1 do
        x_array2 = x_array1 + D
        x_array3 = x_array2 + D
        .
        .
        .
        x_arrayλ = x_array<λ-1> + D
        sum1 = sum2 = . . . = sumλ = 0
        for k = 0 to Taps-1 do
            sum1 = sum1 + x_array1[k]*h[i + k*I]
            sum2 = sum2 + x_array2[k]*h[i + k*I]
            .
            .
            .
            sumλ = sumλ + x_arrayλ[k]*b[i + k*I]
        end for k
        y[i + j*λ*I]       = sum1
        y[i + j*λ*I + I]   = sum2
        .
        .
        y[i + j*λ*I + (λ-1)I] = sumλ
    end for j
    x = x + (differential_offset & 3)
    differential_offset = differential_offset >> 2
end for I
```

In operation, the first signal may be arranged into an X matrix, such as the X matrix described with reference to FIG. 3. Input shift registers (X) 602 may be used to hold the X matrix. The differential offset parameter for a particular filter may be used to construct the rows by proper shifting of input samples. The X matrix may be convoluted with the time varying filter (columns of H matrix), to remove noise at polyphase filter 604. The result of the convolution is stored in decimated form in output buffer (Y) 606.

The pseudo-code shown above may illustrate the implementation of an embodiment for implementing a general I/D multirate filter and can be optimized for any processors supporting multiple MAC units. For optimization purpose there is one restriction in this algorithm. If the processor is capable of computing A MACs in parallel, then the input buffer which this algorithm can process would be of length $(\lambda D)M$, where M is any non-zero positive integer. The length of output buffer would be $(\lambda I)M$. The input buffer is pointed by x, and the output buffer is pointed by y. The program variables x_array1, x_array2, . . . x_array$\lambda$ will be used to point at different locations of input array x separated by D. The variables sum1, sum2, . . . sum$\lambda$ will be used to hold the accumulated FIR outputs. The variable Taps is equal to number of rows of matrix R. The algorithm assumes starting index of arrays to be zero. If the compiler supports pointer arithmetic then pointers with proper post-increments can replace the indexed arrays. All the statements in the innermost loop beginning with "for k=0 to Taps−1 do" should be executed in parallel.

While certain features of the embodiments have been illustrated as described herein, many modifications, substitutions, changes and equivalents will now occur to those skilled in the art. It is, therefore, to be understood that the appended claims are intended to cover all such modifications and changes as fall within the true spirit of the embodiments.

What is claimed is:

1. A method to perform sampling rate conversion, comprising:
   receiving a first signal at a first sampling rate; and
   converting said first signal to a second signal with a second sampling rate using a plurality of Multiply-Accumulator (MAC) units and a differential offset parameter.

2. The method of claim 1, wherein said first signal comprises a plurality of input samples, and said second signal comprises a plurality of output samples.

3. The method of claim 2, wherein said converting comprises:
   interpolating said first signal to form an intermediate signal with an intermediate sampling rate;
   filtering said intermediate signal to remove noise; and
   decimating said intermediate signal to form said second signal.

4. The method of claim 3, wherein said interpolating comprises:
   determining an interpolation factor l; and
   creating a matrix of intermediate samples using the said input samples and said interpolation factor I.

5. The method of claim 4, wherein said filtering comprises:
   forming a matrix H with a plurality of vector coefficients; and
   convoluting matrix X with matrix H to form a matrix Y.

6. The method of claim 5, wherein said decimating comprises:
   determining a first number of MAC units;
   determining a decimation factor D;
   determining a differential offset parameter and calculating a second number of output samples in parallel in accordance with said first number, said decimation factor D and said differential offset parameter.

7. The method of claim 6, wherein said calculating comprises:
   calculating a first output sample using an input row vector of matrix X;
   shifting said input row vector of matrix X using said differential offset parameter; and
   calculating, a second output sample using said shifted input row vector of matrix X.

8. An article comprising:
   a storage medium;
   said storage medium including stored instructions that, when executed by a processor, result in performing sampling rate conversion by receiving a first signal at a first sampling rate, and converting said first signal to a second signal with a second sampling rate using a plurality of Multiply-Accumulator (MAC) units and a differential offset parameter.

9. The article of claim 8, wherein the stored instructions, when executed by a processor, further result in said first signal comprising a plurality of input samples, and said second signal comprising a plurality of output samples.

10. The article of claim 9, wherein the stored instructions, when executed by a processor, further result in said converting by arranging said first signal to form a matrix X using said input samples and said interpolation factor I.

11. The article of claim 10, wherein the stored instructions, when executed by a processor, further result in said filtering by forming a matrix H with a plurality of vector coefficients, and convoluting said matrix X with said matrix H to form a matrix Y.

12. The article of claim 11, wherein the stored instructions, when executed by a processor, further result in said decimating by determining a first number of MAC units, determining a decimation factor D, determining a differential offset parameter, and calculating a second number of output samples in parallel in accordance with said first number, said decimation factor D and said differential offset parameter.

13. The article of claim 12, wherein the stored instructions, when executed by a processor, farther result in said calculating by calculating a first output sample using an input row vector of matrix X, shifting said input row vector of matrix X using said differential offset parameter, and calculating a second output sample using said shifted input row vector of matrix X.

14. A multirate filter, comprising:
   an input shift register to hold a matrix X;
   a poly-phase filter connected to said input shift register;
   an output buffer connected to said filter;
   a processor having a plurality of Multiply-Accumulate (MAC) units connected to said input shift register, said poly-phase filter and said output buffer; and
   wherein said input shift register, poly-phase filter and output buffer process multiple sample values in parallel using said plurality of MAC units and a differential offset parameter to convert a first signal having an input sampling rate to a second signal having an output sampling rate.

15. The multirate filter of claim 14, wherein said first signal is arranged into said matrix X using an interpolation factor I, and said matrix X is sent to said polyphase filter.

16. The multirate filter of claim 15, wherein said filter receives said matrix X, and uses said plurality of MAC units and said differential offset parameter to filter multiple sample values from said matrix X in parallel to form a predetermined number of output samples in a single computational cycle, wherein said predetermined number matches said plurality of MAC units, and sends said filtered output samples to said output buffer.

17. The multirate filter of claim 16, wherein said output buffer receives said filtered and decimated signal.

18. A system, comprising:
  a data source to originate a first signal having a plurality of input sample values sampled at an input sampling rate;
  a multirate filter having a plurality of Multiply-Accumulate (MAC) units, said multirate filter configured to receive said first signal and convert said first signal to a second signal having a plurality of output sample values sampled at an output sampling rate by processing multiple input sample values in parallel;
  a data destination to receive said second signal; and
  an antenna to transmit and receive said signals.

19. The system of claim 18, wherein said multirate filter further comprises:
  an input shift register;
  a poly-phase filter connected to said input shift register;
  an output buffer connected to said, filter;
  a processor having said a plurality of Multiply-Accumulate (MAC) units connected to said input shift register, said filter and said output buffer; and
  wherein said input shift register, poly-phase filter and output buffer use said plurality of MAC units and a differential offset parameter to process said multiple input sample values in parallel.

20. The system of claim 19, wherein said first signal is arranged in said input shift register into a matrix X using an interpolation factor I, and said matrix X is sent to said polyphase filter.

21. The system of claim 20, wherein said filter receives said matrix X, and uses said plurality of MAC units and said differential offset parameter to filter multiple sample values from said matrix X in parallel to form a predetermined number of output samples in a single computational cycle, wherein said predetermined number matches said plurality of MAC units, and sends said filtered output samples to said output buffer.

* * * * *

UNITED STATES PATENT AND TRADEMARK OFFICE
CERTIFICATE OF CORRECTION

PATENT NO. : 6,847,313 B2
DATED : January 25, 2005
INVENTOR(S) : Biswas

It is certified that error appears in the above-identified patent and that said Letters Patent is hereby corrected as shown below:

Column 9,
Line 51, delete "1" and insert -- I --.
Line 64, delete "and" and insert -- ; and --.

Column 10,
Line 41, delete "farther" and insert -- further --.

Column 12,
Line 1, delete "said," and insert -- said --.

Signed and Sealed this

Seventh Day of June, 2005

JON W. DUDAS
*Director of the United States Patent and Trademark Office*